(12) United States Patent
Lu et al.

(10) Patent No.: US 10,730,759 B2
(45) Date of Patent: Aug. 4, 2020

(54) INVERSE OPAL MATERIAL FOR VISIBLE-LIGHT DRIVEN PHOTOCATALYTIC DEGRADATION OF ORGANIC POLLUTANTS, AND PREPARATION METHOD THEREOF

(71) Applicant: SOOCHOW UNIVERSITY, Suzhou (CN)

(72) Inventors: Jianmei Lu, Suzhou (CN); Najun Li, Suzhou (CN)

(73) Assignee: SOOCHOW UNIVERSITY, Suzhou (CN)

( * ) Notice: Subject to any disclaimer, the term of this patent is extended or adjusted under 35 U.S.C. 154(b) by 169 days.

(21) Appl. No.: 15/993,541

(22) Filed: May 30, 2018

(65) Prior Publication Data
US 2018/0346343 A1 Dec. 6, 2018

(30) Foreign Application Priority Data
Jun. 1, 2017 (CN) .......................... 2017 1 0405712

(51) Int. Cl.
| | | |
|---|---|---|
| C01G 23/047 | (2006.01) | |
| C01G 23/053 | (2006.01) | |
| B01J 35/00 | (2006.01) | |
| B01J 37/03 | (2006.01) | |
| B01J 37/16 | (2006.01) | |
| C30B 7/14 | (2006.01) | |
| B01J 21/06 | (2006.01) | |
| C30B 7/08 | (2006.01) | |
| B01J 27/24 | (2006.01) | |
| C01G 23/08 | (2006.01) | |
| C30B 29/60 | (2006.01) | |

(Continued)

(52) U.S. Cl.
CPC .......... *C01G 23/047* (2013.01); *B01J 21/063* (2013.01); *B01J 27/24* (2013.01); *B01J 35/004* (2013.01); *B01J 37/035* (2013.01); *B01J 37/16* (2013.01); *C01G 23/053* (2013.01); *C01G 23/08* (2013.01); *C30B 7/08* (2013.01); *C30B 7/14* (2013.01); *C30B 29/16* (2013.01); *C30B 29/60* (2013.01); *B82Y 20/00* (2013.01); *B82Y 40/00* (2013.01); *C01P 2002/52* (2013.01); *C01P 2002/54* (2013.01); *C01P 2004/03* (2013.01); *C02F 1/30* (2013.01); *C02F 2101/308* (2013.01); *C02F 2305/10* (2013.01); *Y02W 10/37* (2015.05)

(58) Field of Classification Search
None
See application file for complete search history.

(56) References Cited

FOREIGN PATENT DOCUMENTS

CN 103143379 A * 6/2013

OTHER PUBLICATIONS

CN103143379A English Translation (Year: 2013).*

* cited by examiner

*Primary Examiner* — Anita Nassiri-Motlagh
(74) *Attorney, Agent, or Firm* — SZDC Law P.C.

(57) ABSTRACT

A preparation method of inverse opal material for visible-light-driven photocatalytic degradation of organic pollutants includes 1) using titanium dioxide precursor as raw material, preparing nitrogen-doped titanium dioxide inverse opal by one-step process in the presence of nitrogen source, and 2) in the presence of reducing agent, using the nitrogen-doped titanium dioxide inverse opal, selenium precursor, and cadmium precursor as raw materials to prepare the cadmium selenide sensitized nitrogen-doped titanium dioxide inverse opal.

6 Claims, 3 Drawing Sheets

(51) Int. Cl.
  *C30B 29/16* (2006.01)
  *B82Y 20/00* (2011.01)
  *C02F 1/30* (2006.01)
  *C02F 101/30* (2006.01)
  *B82Y 40/00* (2011.01)

INVERSE OPAL MATERIAL FOR VISIBLE-LIGHT DRIVEN PHOTOCATALYTIC DEGRADATION OF ORGANIC POLLUTANTS, AND PREPARATION METHOD THEREOF

This application claims priority to Chinese Patent Application No.: 201710405712.5, filed on Jun. 1, 2017, which is incorporated by reference for all purposes as if fully set forth herein.

FIELD OF THE INVENTION

The present invention belongs to the technical field of inorganic composite materials, particularly relates to an inverse opal material for visible photocatalytic degradation of organic pollutants and its preparation method, which can effectively remove the dyes in the water.

TECHNICAL BACKGROUND

With the development of science and technology, dyes are closely related to human daily life. Today, synthetic dyes are widely used in food, printing and dyeing, cosmetics and pharmaceutical industries. Throughout the world, about 12% of the dyes used are lost in their processing and handling operations. Of which, 20% pass through wastewater into the environment, resulting in pollution of the water environment. It can be seen that dye wastewater seriously endangers the water environment. These dyes are usually biologically toxic and carcinogenic, and difficult to degrade by microorganisms in the environment. Therefore, the search for cheap, efficient and energy-saving methods to degrade dye wastewater has become a hot issue in environmental research.

Since Honda et al. used $TiO_2$ electrodes for hydrogen production by photolysis of water in 1972, the research on semiconductor photocatalysts has developed rapidly. Photocatalysis refers to that by light irradiation, semiconductor generate carriers and undergoes the separation of photogenerated carriers. And then photogenerated electrons and holes combine with ions or molecules to produce reactive radicals with oxidative or reductive properties. These reactive radicals can degrade organic macromolecules into carbon dioxide and water. Therefore, the photocatalytic technology has the advantages of high efficiency and low cost.

Nowadays, the research on photocatalytic performance of $ZnO$, $TiO_2$, $CdS$ and $SnO_2$ is becoming more and more important. Among them, titanium dioxide has many advantages, such as good photocatalytic activity, high stability, acid and alkali resistance, non-toxic to the biological, rich sources and low cost, so it is the most frequently used for photocatalytic research. However, the application of titanium dioxide in the field of photocatalysis has been limited by the following factors: 1), the recombination of photogenerated electrons and holes leads to low quantum yield. 2), $TiO_2$ has a wide band gap of 3.2 eV and exhibits photocatalytic activity under ultraviolet excitation. 3), the mass transfer rate between $TiO_2$ and pollutant is low.

SUMMARY OF THE INVENTION

The purpose of the present invention is to provide inverse opal material for visible-light-driven photocatalytic degradation of organic pollutants, and preparation method thereof, so as to remove dyes in water body effectively.

In order to achieve the above purpose, the invention adopts the follow technical scheme:

A preparation method of inverse opal material for visible-light-driven photocatalytic degradation of organic pollutants, comprising the following steps:
1) using titanium dioxide precursor as raw material, preparing nitrogen-doped titanium dioxide inverse opal (N—$TiO_2$ IO) by one-step process in the presence of nitrogen source,
2) in the presence of reducing agent, using the nitrogen-doped titanium dioxide inverse opal, selenium precursor, and cadmium precursor as raw materials to prepare the cadmium selenide sensitized nitrogen-doped titanium dioxide inverse opal (CdSe/N—$TiO_2$ IO).

In above technical scheme, said nitrogen source is urea, said titanium dioxide precursor is selected from titanium tetrachloride, tetra-n-butyl titanate, or titanium isopropoxide, said reducing agent is selected from sodium borohydride, sodium bisulfite, or sodium sulfite, said selenium precursor is selenium, said cadmium precursor is cadmium chloride.

In above technical scheme, the step 1) is, soaking polymer microsphere templates in a mixed solution of titanium dioxide precursor and nitrogen source solution, and then drying and calcining to obtain the nitrogen-doped titanium dioxide inverse opal, the step 2) is, mixing said reducing agent, said nitrogen-doped titanium dioxide inverse opal, said selenium precursor, said cadmium precursor and solvent and heating to react, then cooling the mixture, washing and drying to obtain the cadmium selenide sensitized nitrogen-doped titanium dioxide inverse opal.

In above technical scheme, said polymer microsphere templates are polystyrene spheres with a particle size of 200~600 nm, the titanium dioxide precursor solution includes ethanol and complexing agent (for instance, acetylacetone, diethanol amine, or triethylamine), the solvent for nitrogen source solution is ethanol, said solvent in step 2) is selected from water, ethylene glycol or ethanol.

In above technical scheme, in step 1), the drying temperature is 50~70° C., and the calcining temperature is 400~500° C., in step 2), the reaction temperature is 180~200° C., the reaction time is 8~10 hours, the drying temperature is 60~80° C.

In above technical scheme, the quality of nitrogen source is 0.2~0.6 times of that of titanium dioxide precursor, and the quality of selenium precursor, cadmium precursor and reducing agent are 0.1~0.3, 0.2~0.7 and 0.2~0.5 times of that of nitrogen-doped titanium dioxide inverse opal respectively.

The preparation method of the present invention is illustrated as follows:
1. One-step synthesis of nitrogen-doped $TiO_2$ inverse opal (N—$TiO_2$ IO), which comprises the following steps: (1) Monodispersed polystyrene (PS) spheres with particle sizes around 200-600 nm are prepared and used to prepare PS opals by vertical deposition with FTO glass. (2) Dissolving complexing agent in ethanol, followed by continuous stirring for 10~20 min. Then, tetrabutyl titanate is added to the mixture, and the mixture is indexed as A solution. Subsequently, urea is added to ethanol, and the solution is denoted as B solution. Then, mixing 1~3 mL A solution and 1~3 mL B solution homogeneously to get the PS opals which is immersed into the mixed solution and dried at 50~70° C. Finally, the PS templates is removed via calcination in air at 400~500° C. at a heating rate of 1~2° C. $min^1$ for 2 h, to obtain N—$TiO_2$ IO.
2. The preparation of N-doped and CdSe-sensitized $TiO_2$ inverse opal (CdSe/N—$TiO_2$ IO) includes the follow steps:

0.1~0.2 g $CdCl_2$, 0.05~0.1 g Se and 0.2~0.3 g $Na_2SO_3$ are added to 35 mL deionized water.

After vigorously stirring for 30 min, the suspension is set into a hydrothermal reactor along with N—$TiO_2$ IO. Heating the reactor to 180~200° C. and keeping for 8~10 h. After naturally cooling to room temperature, the FTO glass is collected, washed with deionized water, and dried to obtain N-doped and CdSe-sensitized $TiO_2$ inverse opals (CdSe/N—$TiO_2$ IO) The present invention also disclosed an inverse opal material for visible-light-driven photocatalytic degradation of organic pollutants prepared by the preparation method.

The present invention also disclosed a preparation method of nitrogen-doped titanium dioxide inverse opal comprising, soaking polymer microsphere templates in a mixed solution of titanium dioxide precursor and nitrogen source solution, and then drying and calcining to obtain the nitrogen-doped titanium dioxide inverse opal.

A method for degrading organic pollutants is characterized by comprising the following steps:

a) using titanium dioxide precursor as raw material, preparing nitrogen-doped titanium dioxide inverse opal by one-step process in the presence of nitrogen source, b) in the presence of reducing agent, using the nitrogen-doped titanium dioxide inverse opal, selenium precursor, and cadmium precursor as raw materials to prepare the cadmium selenide sensitized nitrogen-doped titanium dioxide inverse opal, c) adding the nitrogen-doped titanium dioxide inverse opal or the cadmium selenide sensitized nitrogen-doped titanium dioxide inverse opal into organic pollutant solution to achieve the degradation of organic pollutants.

Compared with existing technologies, the present invention has the advantages as followed:

(1) $TiO_2$ IO was obtained by filling the voids of PS opal templates with the help of capillary force and then etching or sintering the templates. $TiO_2$ IO was porous material, which had large surface area and good mass transfer performance compared to traditional $TiO_2$ nanoparticles and was conducive to the diffusion of reactants in photocatalytic reactions. The three-dimensional pore structure of $TiO_2$ inverse opal has high light absorption efficiency, which can increase the visible light scattering and enhance the interaction of photons and materials, and thus improve the photocatalytic efficiency.

(2) In N—$TiO_2$ IO, nitrogen was partly doped into the lattice of $TiO_2$ and changed the original atomic orbital valence of $TiO_2$ to form the mixed state of O (2p) and N (2p), so that the band gap of $TiO_2$ was narrowed and the absorption spectra of $TiO_2$ was extended to the visible region.

(3) In this invention, CdSe was a narrow band gap semiconductor, which had a wide light absorption range. CdSe can effectively improve the photocatalytic activity and the photogenerated charge separation efficiency. Therefore, the synergistic effects of nitrogen doping and CdSe sensitization can significantly improve the photocatalytic activity of $TiO_2$.

DETAILED DESCRIPTION OF THE INVENTION

The invention is further explained according to the figures and the specific embodiments.

Embodiment 1: Synthesis of Nitrogen-Doped $TiO_2$ Inverse Opal (N—$TiO_2$ IO)

0.25 g diethanolamine was dissolved in 15 g anhydrous ethanol, followed by continuous stirring for 20 min. Then, 0.5 g tetrabutyl titanate was added to the mixture, and the mixture was indexed as A solution. Subsequently, 0.29 g urea was added to 30 mL anhydrous ethanol, and the solution was denoted as B solution. Then, 1 mL A solution and 1 mL B solution were mixed homogeneously. The PS opals were immersed into the mixed solution and dried at 60° C. Finally, the PS templates were removed via calcination in air at 500° C. at a heating rate of 1° C. $min^{-1}$ for 2 h, and N—$TiO_2$ IO was obtained.

Embodiment 2: Synthesis of Nitrogen-Doped $TiO_2$ Inverse Opal (N—$TiO_2$ IO)

Figure 1:
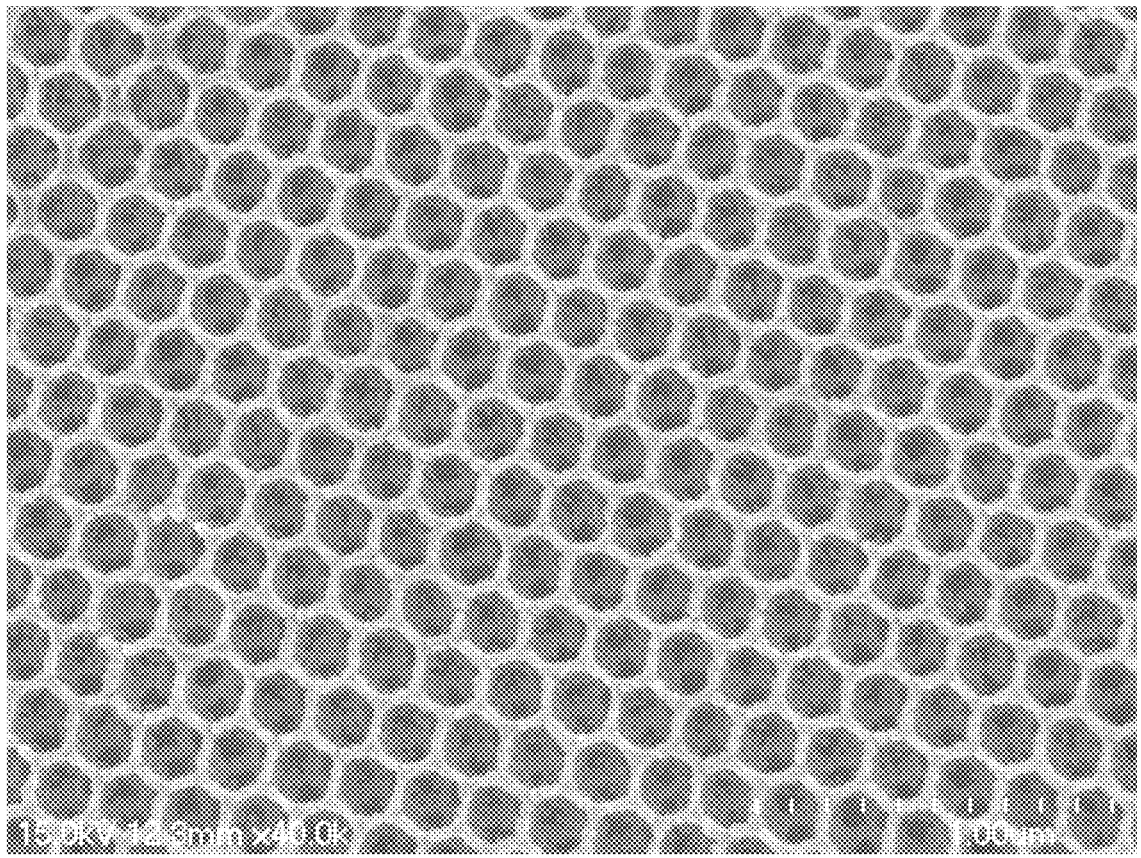
FIG. 1. SEM images of N—$TiO_2$ IO in Embodiment 2.

0.125 g acetylacetone was dissolved in 17.5 g anhydrous ethanol, followed by continuous stirring for 10 min. Then, 0.5 g tetrabutyl titanate was added to the mixture, and the mixture was indexed as A solution. Subsequently, 0.29 g urea was added to 30 mL anhydrous ethanol, and the solution was denoted as B solution. Then, 1 mL A solution and 1 mL B solution were mixed homogeneously. The PS opals were immersed into the mixed solution and dried at 60° C. Finally, the PS templates were removed via calcination in air at 500° C. at a heating rate of 1° C. $min^{-1}$ for 2 h, and N—$TiO_2$ IO was obtained. As can be seen in FIG. 1, N—$TiO_2$ IO presents a face centered cubic arrangement with uniform pores.

Embodiment 3: Synthesis of Nitrogen-Doped and CdSe-Sensitized $TiO_2$ Inverse Opal (CdSe/N—$TiO_2$ IO)

Figure 2:
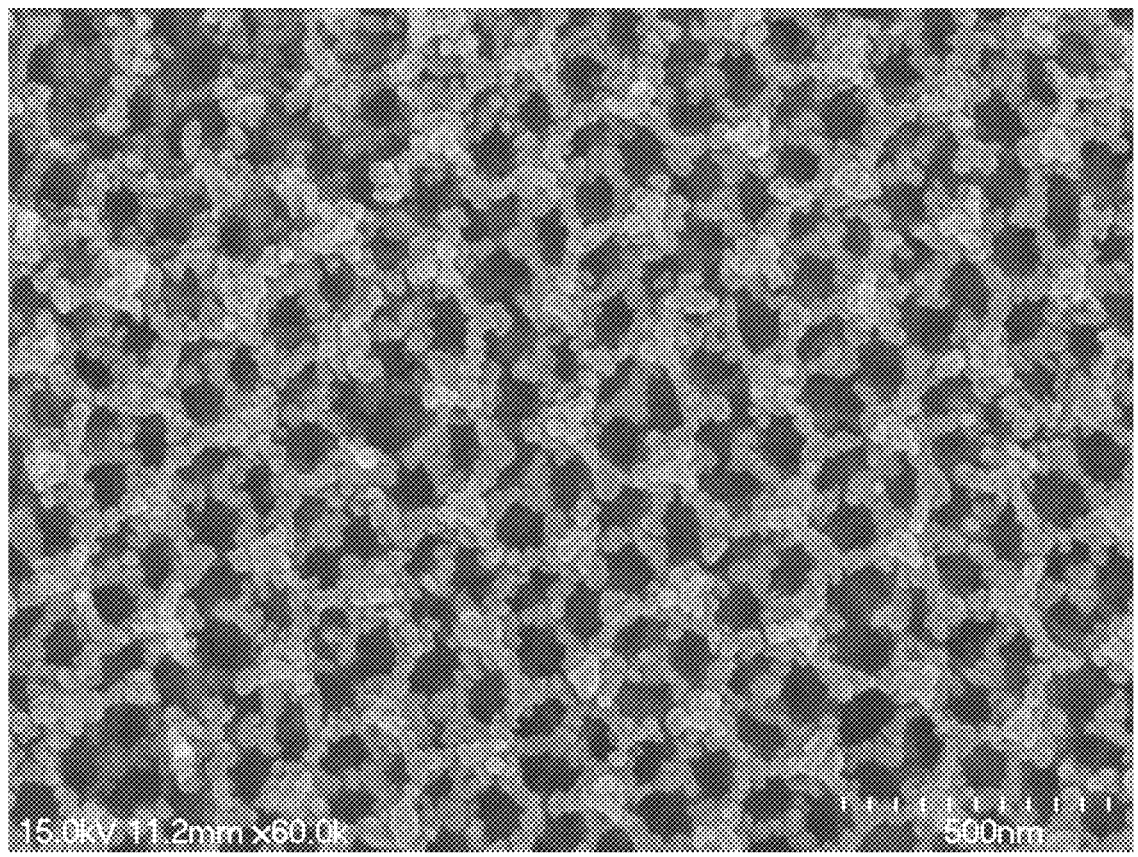
FIG. 2. SEM images of CdSe/N—$TiO_2$ IO in Embodiment 3.
Figure 3:
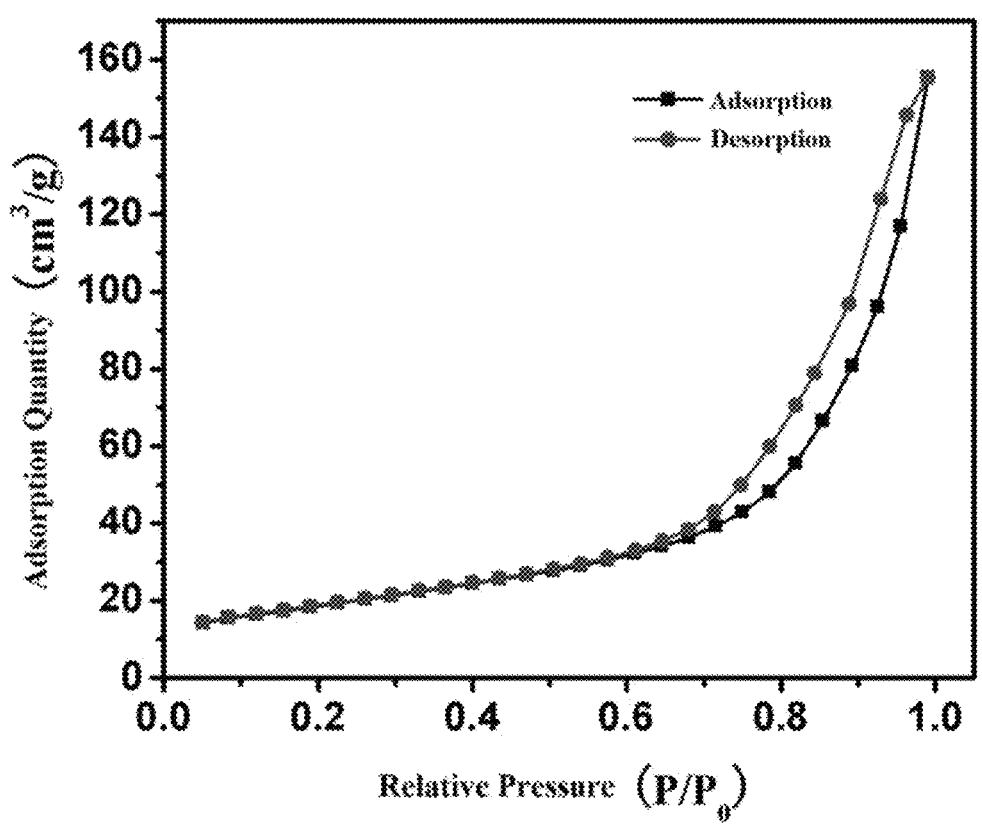
FIG. 3. $N_2$ adsorption-desorption isotherms of CdSe/N—$TiO_2$ IO in Embodiment 3.

0.1830 g $CdCl_2$, 0.0796 g Se and 0.2520 g $Na_2SO_3$ were added to 35 mL deionized water. After vigorously stirring at 3000 rpm, the suspension was transferred into a 50 mL Teflon-lined stainless-steel autoclave along with 20 mg N—$TiO_2$ IO. The autoclave was heated to 180° C. for 8 h. After naturally cooling to room temperature, the FTO glass coated with N-doped and CdSe-sensitized $TiO_2$ inverse opals (CdSe/N—$TiO_2$ IO) was collected and washed with deionized water. As can be seen in FIG. 2, well-ordered inverse opals were retained after the hydrothermal process and a homogeneous coverage of CdSe can be observed without pore clogging. As can be seen in FIG. 3, the isotherms are identified as type III isotherms. The adsorption quantity is low in low specific pressure region, and the higher the relative pressure, the more adsorption quantity.

Embodiment 4: Synthesis of Nitrogen-Doped and CdSe-Sensitized $TiO_2$ Inverse Opal (CdSe/N—$TiO_2$ IO)

0.1830 g $CdCl_2$, 0.0796 g Se and 0.208 g $NaHSO_3$ were added to 35 mL deionized water. After vigorously stirring, the suspension was transferred into a 50 mL Teflon-lined stainless-steel autoclave along with 20 mg N—$TiO_2$ IO. The autoclave was heated to 180° C. for 8 h. After naturally cooling to room temperature, the FTO glass coated with N-doped and CdSe-sensitized TiO$_2$ inverse opals (CdSe/N—TiO$_2$ IO) was collected and washed with deionized water.

Embodiment 5: Photocatalytic Degradation of Rhodamine B by N—TiO$_2$ IO 50 mg N—TiO$_2$ IO obtained in Embodiment 2 was added into 50 mL of Rhodamine B aqueous solution at a concentration of 5 mg/L. The samples were treated in the dark for 30 min at room temperature to achieve adsorption-desorption equilibrium, and the removal efficiency was about 50%. Then the system was illuminated under a 300 W xenon lamp. At each 10 min interval, 3 mL of solution was extracted and analyzed by recording the variations in the absorption band maximum (554 nm) of RhB using a UV-Vis spectrometer. The concentration of Rhodamine B decreased by about 80% after 50 min of illumination, which was lower than the initial value obviously. After 80 min, the removal rate of Rhodamine B in aqueous solution was about 82%.

Embodiment 6: Photocatalytic Degradation of Rhodamine B by CdSe/N—TiO$_2$ IO 50 mg CdSe/N—TiO$_2$ IO obtained in Embodiment 3 was added into 50 mL of Rhodamine B aqueous solution at a concentration of 5 mg/L. The samples were treated in the dark for 30 min at room temperature to achieve adsorption-desorption equilibrium, and the removal efficiency was about 40%. Then the system was illuminated under a 300 W xenon lamp. At each 10 min interval, 3 mL of solution was extracted and analyzed by recording the variations in the absorption band maximum (554 nm) of RhB using a UV-Vis spectrometer. The concentration of Rhodamine B decreased by about 60% after 10 min of illumination, and decreased significantly after 60 min. After 80 min, the removal rate of Rhodamine B in aqueous solution was about 98%. In this experiment, the degradation efficiency of Rhodamine B in water was greatly improved by the synergistic effect of nitrogen doping and sensitization with cadmium selenide.

Embodiment 7: Photocatalytic Degradation of Rhodamine B by CdSe/N—TiO$_2$ IO 50 mg CdSe/N—TiO$_2$ IO obtained in Embodiment 3 was added into 50 mL of Rhodamine B aqueous solution at a concentration of 10 mg/L. The samples were treated in the dark for 30 min at room temperature to achieve adsorption-desorption equilibrium, and the removal efficiency was about 35%. Then the system was illuminated under a 300 W xenon lamp. At each 10 min interval, 3 mL of solution was extracted and analyzed by recording the variations in the absorption band maximum (554 nm) of RhB using a UV-Vis spectrometer. The concentration of Rhodamine B decreased by about 55% after 30 min of illumination, and decreased obviously after 120 min of illumination. When the light time was 150 min, the removal rate of Rhodamine B was 98.5%.

Embodiment 8: Cycling Photocatalytic Degradation of Rhodamine B by CdSe/N—TiO$_2$ IO The composite in Embodiment 6 was washed with water and 95% ethanol, dried and placed in 50 mL of Rhodamine B aqueous solution at a concentration of 5 mg/L. A 300 W Xenon lamp was used to simulate solar radiation for 80 min. At each 10 min interval, 3 mL of solution was extracted and analyzed by recording the variations in the absorption band maximum (554 nm) of RhB using a UV-Vis spectrometer. The degradation efficiency reaches 97%, 97% and 95% after the first, second and third cycle. This indicates that CdSe/N—TiO$_2$ IO shows good stability after each cycle.

This invention adopted the doping of non-metallic element and sensitization of narrow band gap semiconductor to modify TiO$_2$ nanoparticles. CdSe/N—TiO$_2$ IO was obtained by one-step synthesis of nitrogen-doped and CdSe-sensitized TiO$_2$ inverse opal. The synergistic effects of nitrogen doping and CdSe sensitization can significantly improve the photocatalytic activity of TiO$_2$ IO. The modified catalyst had the advantages of high catalytic activity and recyclability.

What we claim:

1. A preparation method of inverse opal material for visible-light-driven photocatalytic degradation of organic pollutants, comprising the following steps:
   1) using a titanium dioxide precursor as raw material, preparing a nitrogen-doped titanium dioxide inverse opal by a one-step process in the presence of a nitrogen source; and
   2) in the presence of a reducing agent, using the nitrogen-doped titanium dioxide inverse opal, a selenium precursor, and a cadmium precursor as raw materials to prepare a cadmium selenide sensitized nitrogen-doped titanium dioxide inverse opal,
   wherein the step 1) comprises mixing the titanium dioxide precursor and nitrogen source in ethanol to form a mixed solution of the titanium dioxide precursor and nitrogen source, soaking polymer microsphere templates in the mixed solution of the titanium dioxide precursor and nitrogen source, and then drying and calcining to obtain the nitrogen-doped titanium dioxide inverse opal; and the step 2) comprises mixing the reducing agent, the nitrogen-doped titanium dioxide inverse opal, the selenium precursor, the cadmium precursor and a solvent, heating, cooling, washing and drying to obtain the cadmium selenide sensitized nitrogen-doped titanium dioxide inverse opal.

2. The preparation method of inverse opal material for visible-light-driven photocatalytic degradation of organic pollutants according to claim 1, wherein said nitrogen source is urea, said titanium dioxide precursor is titanium tetrachloride, tetra-n-butyl titanate, or titanium isopropoxide, said reducing agent is sodium borohydride, sodium bisulfite, or sodium sulfite, said selenium precursor is selenium, and said cadmium precursor is cadmium chloride.

3. The preparation method of inverse opal material for visible-light-driven photocatalytic degradation of organic pollutants according to claim 1, wherein the quantity of nitrogen source is 0.2-0.6 times of that of titanium dioxide precursor, and the quantity of selenium precursor, cadmium precursor and reducing agent are 0.1-0.3, 0.2~0.7 and 0.2-0.5 times of that of nitrogen-doped titanium dioxide inverse opal, respectively.

4. The preparation method of inverse opal material for visible-light-driven photocatalytic degradation of organic pollutants according to claim 1, wherein said polymer microsphere templates are polystyrene spheres with a particle size of 200-600 nm, said solvent in step 2) is water, ethylene glycol or ethanol.

5. The preparation method of inverse opal material for visible-light-driven photocatalytic degradation of organic pollutants according to claim 1, wherein in step 1), the drying temperature is 50-70° C., and the calcining temperature is 400-500° C., in step 2), the temperature of heating is 180-200° C., the time of heating is 8-10 hours, the drying temperature is 60-80° C.

6. The preparation method of inverse opal material for visible-light-driven photocatalytic degradation of organic pollutants according to claim 1, wherein said polymer microsphere templates are prepared by a vertical deposition method.

* * * * *